United States Patent [19]

Oritsuki et al.

[11] Patent Number: 4,482,804
[45] Date of Patent: Nov. 13, 1984

[54] PHOTOSENSOR ARRAY WHEREIN EACH PHOTOSENSOR COMPRISES A PLURALITY OF AMORPHOUS SILICON P-I-N DIODES

[75] Inventors: Ryoji Oritsuki; Yukio Ichimura, both of Mobara; Hiromi Kanai, Chiba; Kenichi Shimada, Chosei, all of Japan

[73] Assignee: Hitachi, Ltd., Tokyo, Japan

[21] Appl. No.: 418,563

[22] Filed: Sep. 15, 1982

[30] Foreign Application Priority Data

Sep. 18, 1981 [JP] Japan ................................ 56-146267

[51] Int. Cl.³ ............................................. H04N 1/036
[52] U.S. Cl. ................................ 250/211 J; 250/578; 357/2; 358/213; 358/293; 358/294
[58] Field of Search .......................... 250/578, 211 J; 358/212, 213, 285, 293, 294; 357/2, 58, 30

[56] References Cited

U.S. PATENT DOCUMENTS

| | | | |
|---|---|---|---|
| 3,604,987 | 9/1971 | Assour | 250/578 X |
| 4,341,954 | 7/1982 | Mizushima et al. | 357/30 |
| 4,390,791 | 6/1983 | Hatanaka et al. | 250/578 |
| 4,408,230 | 10/1983 | Tamura et al. | 358/213 |
| 4,419,696 | 12/1983 | Hamano et al. | 250/211 J |

Primary Examiner—Edward P. Westin
Attorney, Agent, or Firm—Charles E. Pfund

[57] ABSTRACT

In a photosensor apparatus of the type including one dimensional photosensor array in which a plurality of photosensors mounted on a transparent substrate at a predetermined spacing are respectively connected in series with blocking diodes which select outputs of the photosensors. Each one of the photosensors comprises a plurality of laminated amorphous silicon diodes comprising p-i-n junction layers. Each blocking diode comprises at least one amorphous silicon diode having a p-i-n junction layer, and each photosensor generates an electromotive force larger than a forward voltage drop across each blocking diode.

1 Claim, 5 Drawing Figures

PHOTOSENSOR ARRAY WHEREIN EACH PHOTOSENSOR COMPRISES A PLURALITY OF AMORPHOUS SILICON P-I-N DIODES

BACKGROUND OF THE INVENTION

This invention relates to photosensor array apparatus, and more particularly to photosensor array apparatus in which the photoresponse speed of a photosensor is improved.

In photosensor array apparatus used at a light input portion of a facsimile, letter reader or the like, a so-called line sensor is generally used in which a plurality of photosensors are arranged along a straight line for reading picture images. By driving, at a high speed, such a line sensor, light reflected from a picture is converted into electric signals for improving read out efficiency.

Recently, as a photosensor, an i-type amorphous silicon diode made of an i-type amorphous silicon film having a photoconductive effect has been proposed because it strongly absorbs light reflected from the picture and can use low cost substrate material. Where such an i-type amorphous silicon diode is used as the photosensor, its response speed is about 0.1-1 ms when the intensity of light from a light source is about 100 luxes. When the amorphous silicon diode is applied to a facsimile, the time required for reading one line is about 5-10 ms so that about 20 seconds are required to read a manuscript having a size of A4 (210 mm×297 mm). Although this read time is a standard value for a present time high speed facsimile device, in recent years it is desirable to increase the photoresponse speed of the photosensor with increase in the operating speed of the facsimile device. Where the line sensor made of the i-type amorphous silicon is driven at a high speed, the photoresponse speed presents a problem. More particularly, when light having energy larger than the energy gap between conduction band and valence band of amorphous silicon is irradiated, the electrons in the valence band migrate to conduction band, leaving holes. When either electrons or holes migrate as majority carriers, minority carriers are trapped temporarily to delay the photoresponse speed. For example, in photosensor array apparatus where electrons act as the majority carriers, holes are trapped so that it takes several milliseconds for recovery to an original dark current level with error of less than about 1% when light is off, thus degrading the residual image characteristic and delaying the light response characteristic.

SUMMARY OF THE INVENTION

Accordingly, it is an object of this invention to provide an improved photsensor array having improved photoresponse speed by constructing the sensor with a p-i-n junction photovoltaic cell comprising amorphous silicon.

According to this invention, there is provided a photosensor apparatus of the type including one dimensional photosensor array in which a plurality of photosensors mounted on a transparent substrate at a predetermined spacing are respectively connected in series with blocking diodes which select outputs of the photosensors, characterized in that each one of the photosensors comprises a plurality of laminated amorphous silicon diodes comprising p-i-n junction layers, that each of the blocking diodes comprises at least one amorphous silicon diode having a p-i-n junction layer, and that each photosensor generates an electromotive force larger than a forward voltage drop across each one of the blocking diodes.

DESCRIPTION OF THE PREFERRED EMBODIMENT

As described above, according to this invention, a photosensor is made of a photoelectric cell having a p-i-n junction construction consisting of amorphous silicon. The p-i-n junction photovoltaic cell generates electromotive force principally by the p-i junction, so that it is characterized by being not affected by the trapped carriers described above. However, when a plurality of photosensors arranged in one dimensional matrix array are driven, it is essential to provide serially connected blocking diodes for selecting the outputs of respective photosensors and for preventing cross-talks. Since the forward voltage drop across such blocking diodes is of the order of 0.5 V, the output of the p-i-n junction photovoltaic cell should be larger than the forward voltage drop by about 0.5 V. Consequently, the p-i-n junction photovoltaic force cell must be provided in a plurality of stages, e.g. in at least two stages so as to increase the generated electromotive force by more than 0.5 V thereby to obtain signals having voltages sufficiently larger than the forward voltage drop.

Figure 1:
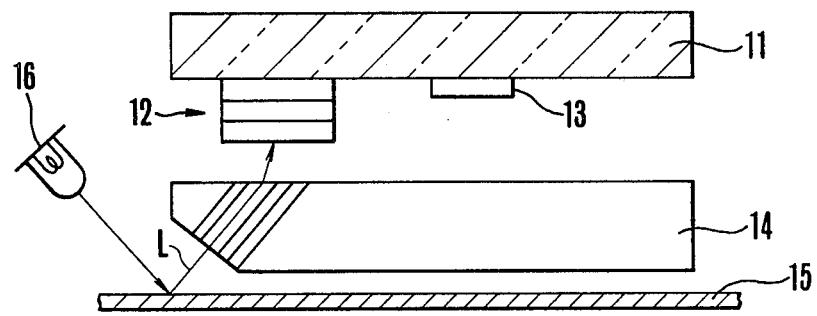
FIG. 1 is a side view, partly sectioned, of an optical reader to which the invention is applied.

The invention will now be described in detail with reference to the accompanying drawing. As shown in FIG. 1, an optical reader to which the invention is applied comprises a transparent substrate 11 carrying photosensors 12 and blocking diodes 13 to form a photosensor apparatus incorporating the invention, a contact fiber substrate 14 with optical fibers, and a light source 16. Light from the light source 16 is directed to a manuscript 15 and reflected light L passes through the optical fibers in the substrate 14 to reach the photosensors 12.

Figure 2:
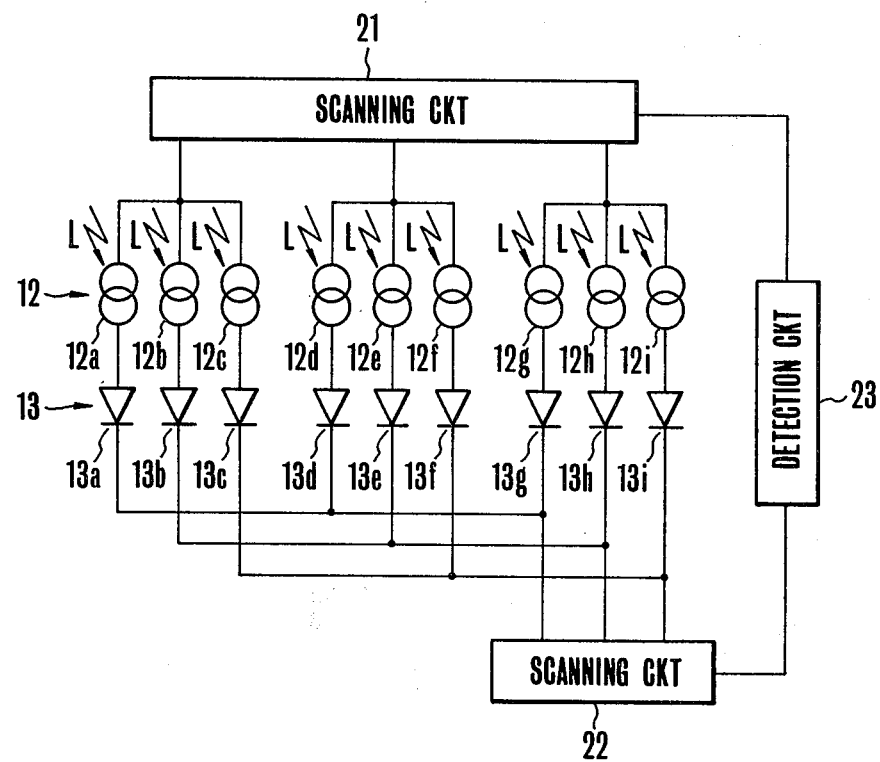
FIG. 2 is an electrical connection diagram of a photosensor array apparatus embodying the invention.

In the photosensor apparatus, as shown in FIG. 2, the photosensor 12 is constituted by a plurality of photovoltaic cells 12a–12i disposed at predetermined spacings, each cell being formed by laminating three p-i-n junction amorphous silicon diodes on the transparent substrate 11. Each one of the amorphous silicon diodes generates an electromotive force of about 0.5 V, so that when 3 diodes are laminated electromotive force of about 1.5 V can be produced. The blocking diode 13 is constituted by diodes 13a–13i each comprising single p-i-n amorphous silicon diode and respectively connected in series with the photovoltaic force cells 12a–12i. Each one of the blocking diodes has a forward voltage drop of about 0.5 V. There are also provided first and second scanning circuits 21 and 22 for driving the photovoltaic cells in a predetermined order and a detection circuit 23 for converting the electromotive forces generated by the cells 12a–12i into output electric signals. Since each of the photovoltaic cells 12a–12i is constituted by 3 laminated amorphous silicon diodes, when reflected light L from the manuscript 15 impinges upon the cells, these cells produce output voltages of about 1.5 V. In the absence of the light irradiation, there is no output. This output voltages of about 1.5 V is reduced by about 0.5 V of the forward voltage drops across respective blocking diodes 13a–13i, i.e. amorphous silicon diodes so that a relatively large output voltage of about 1.0 V can be detected.

Figure 3:
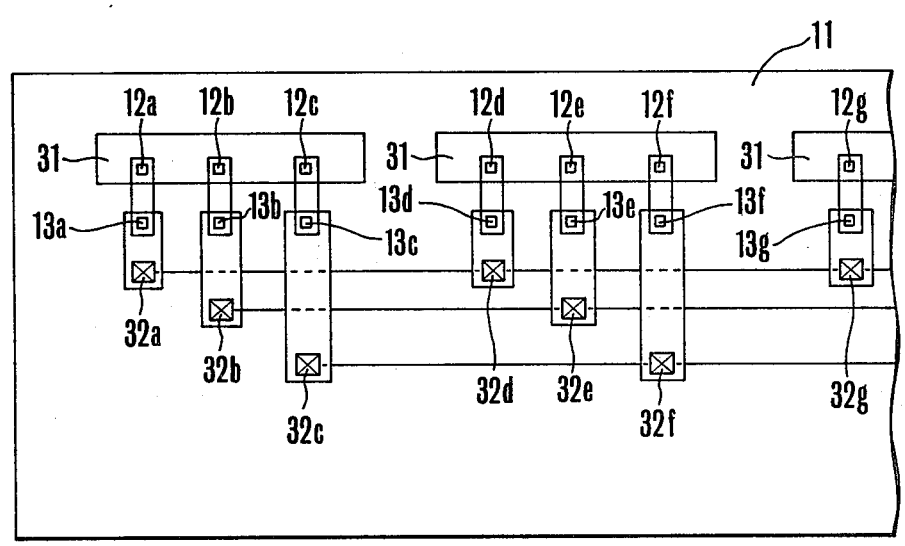
FIG. 3 is a fragmentary plan view of the photosensor array apparatus.

The photovoltaic cells 12a, 12b, . . . and the blocking diodes 13a, 13b, . . . are arranged on the glass substrate 11 as shown in FIG. 3. In each group consisting of three photovoltaic cells in FIG. 3, the photovoltaic cells and blocking diodes are coupled together, and the three photovoltaic cells are electrically connected to each other by a transparent elecctrode 31. Leads from the respective blocking diodes in one group are connected to those in another group through through-holes 32a and 32d, 32b and 32e, . . . .

Figure 5:
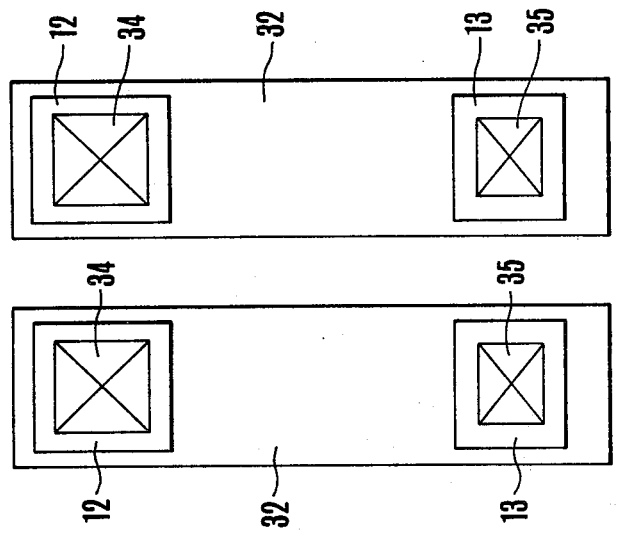
FIG. 5 is an enlarged fragmentary plan view of FIG. 4.
Figure 4:
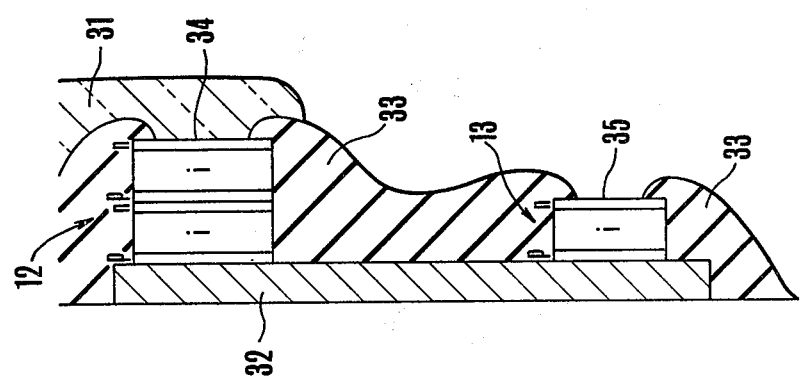
FIG. 4 is an enlarged fragmentary sectional view showing p-i-n junction layers of a photosensor and a p-i-n junction layer of a blocking diode.

As shown in FIGS. 4 and 5, the photosensor 12 comprised of two p-i-n junctions is electrically connected with the blocking diode 13 comprised of one p-i-n junction through a chromium conductor 32. The photosensor 12 is surrounded by an insulator layer 33, excepting its window 34 over which the transparent electrode 31 is applied, and the blocking diode 13 is similarly surrounded by the insulator layer 33, excepting its window 35. Leads from the respective photovoltaic cells and blocking diodes are distributed through windows or through-holes 34 and 35. For simplicity of illustration, the transparent electrode 31 and the insulator layer 33 are not illustrated in FIG. 5.

As described above, since according to this invention photovoltaic cells having a relatively high response speed are used as one dimensional array, it is possible to obtain a photoresponse speed of about 0.01–0.1 ms fairly improved as compared to 0.1–1.0 ms photoresponse speed of the prior art photoconductive cells. This not only makes it possible to greatly reduce the manuscript reading time, but also increases the operating speed of facsimiles.

What is claimed is:

1. In a photosensor apparatus of the type including one dimensional photosensor array in which a plurality of photosensors mounted on a transparent substrate at a predetermined spacing are respectively connected in series with blocking diodes which select outputs of said photosensors, the improvement wherein each one of said photosensors comprises a plurality of laminated amorphous silicon diodes comprising p-i-n junction layers, each of said blocking diodes comprises at least one amorphous silicon diode having a p-i-n junction layer, and wherein each photosensor generates an electromotive force larger than a forward voltage drop across each of said blocking diodes.

* * * * *